(12) United States Patent
Cho et al.

(10) Patent No.: US 11,555,243 B2
(45) Date of Patent: Jan. 17, 2023

(54) APPARATUS FOR TRAPPING REACTION BY-PRODUCT PRODUCED DURING ORGANIC FILM DEPOSITION PROCESS

(71) Applicant: MILAEBO CO., LTD., Pyeongtaek-si (KR)

(72) Inventors: Che Hoo Cho, Seoul (KR); Yeon Ju Lee, Osan-si (KR); Pyung Hee Son, Osan-si (KR); Jin Woong Kim, Osan-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 62 days.

(21) Appl. No.: 17/207,145

(22) Filed: Mar. 19, 2021

(65) Prior Publication Data

US 2022/0228261 A1 Jul. 21, 2022

(30) Foreign Application Priority Data

Jan. 21, 2021 (KR) .......................... 10-2021-0008664

(51) Int. Cl.
*C23C 16/40* (2006.01)
*C23C 16/44* (2006.01)

(52) U.S. Cl.
CPC ................................ *C23C 16/4412* (2013.01)

(58) Field of Classification Search
CPC ................................................ C23C 16/4412
USPC ........... 118/715; 156/345.33, 345.34, 345.29
See application file for complete search history.

(56) References Cited

U.S. PATENT DOCUMENTS

| 4,506,513 A | * | 3/1985 | Max | B01D 8/00 |
| | | | | 62/278 |
| 4,928,497 A | * | 5/1990 | Latge | G21C 19/313 |
| | | | | 210/186 |
| 5,819,683 A | * | 10/1998 | Ikeda | B01D 53/72 |
| | | | | 118/724 |
| 5,820,641 A | * | 10/1998 | Gu | B01D 5/0006 |
| | | | | 55/DIG. 15 |

(Continued)

FOREIGN PATENT DOCUMENTS

| KR | 100717837 B1 | 5/2007 |
| KR | 100862684 B1 | 10/2008 |

(Continued)

*Primary Examiner* — Rudy Zervigon
(74) *Attorney, Agent, or Firm* — Rabin & Berdo, P.C.

(57) ABSTRACT

The present disclosure relates to an apparatus for trapping a reaction by-products produced during an organic film deposition process, and an object of the present disclosure is to provide a trapping apparatus having an internal trapping tower in which disc-type trapping units, which each have structure-type trapping plates having a large surface area per unit area in order to trap reaction by-products contained in an unreacted gas introduced into the trapping apparatus after an organic film deposition process, among semiconductor manufacturing processes, is performed in the process chamber, and a trapping disc configured to concentrate a flow of the gas or disperse or discharge the gas, are vertically arranged in multiple layers, such that the trapping apparatus traps the reaction by-products in the form of a thin film in a state in which the residence time of the gas is increased and uniform temperature distribution is maintained.

13 Claims, 16 Drawing Sheets

(56) References Cited

U.S. PATENT DOCUMENTS

| | | | | |
|---|---|---|---|---|
| 6,488,745 B2* | 12/2002 | Gu | ............ | B01D 53/002 55/DIG. 15 |
| 6,562,109 B2* | 5/2003 | Livingston | ............ | B01D 45/14 55/438 |
| 6,746,516 B2* | 6/2004 | Titmas | ............ | B01D 53/002 62/55.5 |
| 7,044,997 B2* | 5/2006 | Mardian | ............ | B01D 5/0006 96/417 |
| 7,491,291 B2* | 2/2009 | Park | ............ | B01D 8/00 156/345.29 |
| 7,988,755 B2* | 8/2011 | Cho | ............ | C23C 16/4412 55/DIG. 15 |
| 9,057,388 B2* | 6/2015 | Comeau | ............ | C23C 16/50 |
| 10,036,090 B2* | 7/2018 | Komori | ............ | F28B 9/08 |
| 10,801,107 B2* | 10/2020 | Cho | ............ | C23C 16/4412 |
| 10,987,619 B2* | 4/2021 | Cho | ............ | H01L 21/67017 |
| 11,054,174 B2* | 7/2021 | Hwang | ............ | F24H 3/00 |
| 11,117,086 B2* | 9/2021 | Cho | ............ | B01D 45/08 |
| 2003/0037730 A1* | 2/2003 | Yamasaki | ............ | C23C 16/18 257/E21.17 |
| 2006/0162862 A1* | 7/2006 | Park | ............ | C23C 16/4412 118/715 |
| 2006/0169411 A1* | 8/2006 | Han | ............ | C23C 16/4412 156/345.29 |
| 2006/0264045 A1* | 11/2006 | Gu | ............ | C23C 16/4412 438/680 |
| 2008/0166881 A1* | 7/2008 | Taniyama | ............ | H01L 21/3185 438/758 |
| 2009/0107091 A1* | 4/2009 | Cho | ............ | C23C 16/4412 55/440 |
| 2012/0171092 A1* | 7/2012 | Kiernan | ............ | B01D 53/005 423/215.5 |

FOREIGN PATENT DOCUMENTS

| | | |
|---|---|---|
| KR | 101447629 B1 | 10/2014 |
| KR | 101806480 B1 | 1/2018 |
| KR | 102188604 B1 | 12/2020 |

* cited by examiner

APPARATUS FOR TRAPPING REACTION BY-PRODUCT PRODUCED DURING ORGANIC FILM DEPOSITION PROCESS

CROSS-REFERENCE TO RELATED APPLICATIONS

This application claims the priority of Korean Patent Application No. 10-2021-0008664 filed on Jan. 21, 2021, in the Korean Intellectual Property Office, the disclosure of which is incorporated herein by reference.

BACKGROUND

Field

The present disclosure relates to an apparatus for trapping a reaction by-product produced during an organic film deposition process, and more particularly, to a trapping apparatus having an internal trapping tower having a large surface area and a flow velocity reducing structure in order to trap, in the form of a thin film, particulate reaction by-products contained in unreacted gas discharged after an organic film deposition process is performed in a process chamber during a semiconductor manufacturing process, such that the trapping apparatus traps the reaction by-products with high efficiency by increasing a residence time under a condition of a uniform flow velocity and a trapping temperature.

Description of the Related Art

In general, a semiconductor manufacturing process is broadly divided into a front-end process (fabrication process) and a back-end process (assembly process). The front-end process refers to a process of manufacturing semiconductor chips by processing specific patterns by repeatedly performing a procedure of depositing thin films on wafers in various types of process chambers and a procedure of selectively etching the deposited thin films. The back-end process refers to a process of individually separating the chips manufactured in the front-end process and then assembling finished products by combining the chips and lead frames.

In this case, the process of depositing the thin film on the wafer or etching the thin film deposited on the wafer is performed at a high temperature by injecting required process gases such as silane, arsine, boron chloride, and hydrogen, and process gases such as precursor gas required for deposition of the thin film into a process chamber through a gas injection system. In this case, a large amount of gases, such as various types of ignitable gases, corrosive foreign substances, and harmful gases containing toxic substances, are produced in the process chamber.

For this reason, in order to purify and discharge unreacted gases discharged from the process chamber, a semiconductor manufacturing apparatus has a scrubber installed at a rear end of a vacuum pump for creating a vacuum in the process chamber, and the scrubber purifies the unreacted gases discharged from the process chamber and discharges the purified gas into the atmosphere.

However, because the scrubber purifies and processes only gaseous reaction by-products, the unreacted gases discharged from the process chamber adhere to pipes if particulate reaction by-products containing in the unreacted gases discharged from the process chamber are not trapped in advance. As a result, there is a problem in that an exhaust pressure is increased, the vacuum pump is broken down as the particulate reaction by-products enter the vacuum pump, or the particulate reaction by-products flow back into the process chamber and contaminate wafers.

For this reason, a reaction by-product trapping apparatus, which may have various structures, is installed between the process chamber and the vacuum pump in the semiconductor manufacturing apparatus in order to aggregate the unreacted gases, which are discharged from the process chamber, into a powder state.

However, in a structure of an internal trapping tower used in the by-product trapping apparatus in the related art, a plurality of holes having an equal size or different sizes is formed in a surface of a trapping plate, and turbulent flow pieces are additionally formed at the periphery of the plurality of holes, such that turbulent flows having different magnitudes are generated at plurality of points due to difference in flow velocity between a fast flow and a slow flow caused by different magnitudes of loads of gas flows, thereby delaying the gas flow and increasing a contact area between a trapping surface and the unreacted gases. As a result, there is a structural drawback in reducing flow velocities of the unreacted gases and providing uniform and stable gas flows.

Because the structure of the trapping apparatus in the related art does not have a trapping plate having a stable flow velocity reducing structure and high trapping efficiency per unit area, a sufficient trapping condition is not satisfied when the unreacted gases containing fine reaction by-products are discharged and introduced into the trapping apparatus after the organic film deposition process is performed in the process chamber. As a result, there is a problem in that the reaction by-products cannot be trapped in the form of a thin film.

Accordingly, there is a need for development of a reaction by-product trapping apparatus capable of solving the above-mentioned problems.

RELATED ART DOCUMENTS

Patent Documents (Patent Document 1) Korean Patent No. 10-0717837 (May 7, 2007)
(Patent Document 2) Korean Patent No. 10-0862684 (Oct. 2, 2008)
(Patent Document 3) Korean Patent No. 10-1447629 (Sep. 29, 2014)
(Patent Document 4) Korean Patent No. 10-1806480 (Dec. 1, 2017)

SUMMARY

An object of the present disclosure is to provide a trapping apparatus having an internal trapping tower in which disc-type trapping units, which each have structure-type trapping plates having a large surface area per unit area in order to trap reaction by-products contained in an unreacted gas introduced into the trapping apparatus after an organic film deposition process, among semiconductor manufacturing processes, is performed in the process chamber, and a trapping disc configured to concentrate a flow of the gas or disperse or discharge the gas, are vertically arranged in multiple layers, such that the trapping apparatus traps the reaction by-products in the form of a thin film in a state in which the residence time of the gas is increased and uniform temperature distribution is maintained.

Another object of the present disclosure is to provide a trapping apparatus, in which a diffuser having a dual structure extends a low path and diffuses gas, and a heater connected to a lower end of the diffuser implements a uniform temperature in order to improve efficiency in trapping the introduced gas.

An exemplary embodiment of the present disclosure provides an apparatus for trapping a reaction by-product produced during an organic film deposition process, which is supplied with an unreacted gas discharged after a reaction in a process chamber for performing an organic film deposition process among semiconductor manufacturing processes, heats the unreacted gas with a heater, traps particulate reaction by-products with a reduced temperature in an available trapping space, and discharges the remaining gas, the apparatus including: a housing configured to receive and discharge an introduced unreacted gas; a heater positioned inside the housing and configured to uniformly heat the introduced gas while diffusing the gas with a radially arranged diffuser having a dual structure; and an internal trapping tower in which a first disc-type trapping unit, a second disc-type trapping unit, a third disc-type trapping unit, a fourth disc-type trapping unit, and a fifth disc-type trapping unit, which each have structure-type trapping plates radially arranged and having a large surface area per unit area, and a trapping disc having an exhaust hole formed in a central portion thereof or exhaust holes radially arranged in order to concentrate a flow of the gas or uniformly disperse and discharge the gas, are vertically arranged.

In one exemplary embodiment, the first disc-type trapping unit may be configured such that a plurality of radially arranged structure-type trapping plates guides the flow of the gas to the central portion, a central exhaust hole and a plurality of radially arranged circular-hole-type exhaust holes formed in the trapping disc discharge the gas downward, and the structure-type trapping plates and the trapping disc uniformly trap the reaction by-products in the form of a thin film.

In one exemplary embodiment, the plurality of radially arranged structure-type trapping plates may include large and long structure-type trapping plates and small, low, and short structure-type trapping plates which are alternately installed.

In one exemplary embodiment, the second disc-type trapping unit may be configured such that a plurality of radially arranged structure-type trapping plates guides outward the flow of the supplied gas, an inclined guide formed around the trapping disc blocks the flow of the gas supplied from the upper or lateral side, collects the gas, and slows down the flow of the gas, the gas is uniformly discharged downward through radially arranged long-hole-type exhaust holes along the radially arranged structure-type trapping plates, and the structure-type trapping plates and the trapping disc uniformly trap the reaction by-products in the form of a thin film.

In one exemplary embodiment, the inclined guide may be positioned adjacent to an inner diameter of the housing main body or positioned to face the inner diameter of the housing main body, such that the gas uniformly supplied from the first disc-type trapping unit at the uppermost side is not supplied directly to the plurality of disc-type trapping units present at a lower end of the second disc-type trapping unit.

In one exemplary embodiment, the third disc-type trapping unit may be configured such that a plurality of radially arranged dual structure-type trapping plates discharges the supplied gas downward in an outward direction of the trapping disc, the gas is uniformly discharged downward through a plurality of exhaust holes formed in a central portion of the lower trapping disc and long-hole-type exhaust holes arranged radially, and the dual structure-type trapping plates and the trapping disc uniformly trap the reaction by-products in the form of a thin film.

In one exemplary embodiment, the fourth disc-type trapping unit may be configured such that a plurality of radially arranged dual structure-type trapping plates discharges the supplied gas downward in the outward direction of the trapping disc, the gas is uniformly discharged through long-hole-type exhaust holes radially arranged on the lower trapping disc, and the dual structure-type trapping plates and the trapping disc uniformly trap the reaction by-products in the form of a thin film.

In one exemplary embodiment, a circular exhaust plate may be formed to be spaced apart upward from the central portion of the trapping disc at a predetermined interval, such that the lowered gas collides with the circular exhaust plate to improve lateral exhaust efficiency through the dual structure-type trapping plates.

In one exemplary embodiment, the dual structure-type trapping plate may have a vertical plate and first and second horizontal plates that divide the vertical plate into two portions, such that a cross section of the dual structure-type trapping plate has a dual cross shape, and exhaust holes are formed in a longitudinal direction in the first horizontal plate.

In one exemplary embodiment, the second horizontal plate may have a larger cross-sectional area than the first horizontal plate positioned at the upper side and has a shape having a width that increases outward from the central portion of the trapping disc.

In one exemplary embodiment, the fifth disc-type trapping unit may be configured such that a plurality of radially arranged structure-type trapping plates guides the flow of the supplied gas outward, the gas is uniformly discharged downward through long-hole-type exhaust holes radially arranged on the trapping disc around the trapping disc having a smaller diameter than the trapping disc of the fourth disc-type trapping unit and along the relatively many radially arranged structure-type trapping plate, and the structure-type trapping plates and the trapping disc uniformly trap the reaction by-products in the form of a thin film.

In one exemplary embodiment, the structure-type trapping plate may have a vertical plate and a horizontal plate that divides the vertical plate into two portions, such that a cross section of the structure-type trapping plate has a cross shape.

In one exemplary embodiment, the heater may include: a heater main body; and a diffuser fastened to an upper surface of the heater main body and having a dual structure arranged multiple times for supplying transfer heat to the introduced unreacted gas and diffusing the gas, and the diffuser may include: a thermally conductive diffuser plate configured to transfer heat to a region wider than a region of the heater main body; a plurality of inner vertical diffuser plates radially arranged in a circular shape at a central portion of the thermally conductive diffuser plate and configured to diffuse the introduced unreacted gas while uniformly supplying heat; and a plurality of outer vertical diffuser plates radially arranged in a circular shape around the inner diffuser plates on the thermally conductive diffuser plate and configured to subdivide and diffuse the introduced unreacted gas while further subdividing the heat.

According to the reaction by-product trapping apparatus according to the present disclosure having the features as described above, the structure-type trapping plates having a cross-shaped section or a dual cross-shaped section are radially arranged to have the uniform vortex generating structure for increasing the large surface area per unit area and increasing the trapping time, and the trapping disc has the exhaust holes radially arranged to concentrate the flow of gas or uniformly disperse and discharge the gas. Further, the internal trapping tower in which the disc-type trapping units for trapping the reaction by-products are vertically arranged in multiple layers is provided. Further, in order to trap the by-products contained in the unreacted gas discharged after the organic film deposition process, among the manufacturing processes, is performed in the process chamber, the flow velocity of the introduced gas is decreased, and the gas is sequentially supplied downward for each layer to increase the residence time and the distribution of the internal temperature is uniformly maintained. As a result, there is an advantage in that the surface of the structure-type trapping plate may uniformly trap, in the form of a thin film, the by-products contained in the unreacted gas.

In addition, according to the present disclosure, the inclined guide is positioned adjacent to the inner diameter of the housing and formed to be inclined downward around the trapping disc of the disc-type trapping unit, which is positioned at the upper side among the disc-type trapping units constituting the internal trapping tower, such that the gas supplied from the uppermost disc-type trapping unit is concentrated and collected inside the inclined guide and then uniformly and sequentially supplied to the disc-type trapping unit positioned at the lower side thereof instead of being supplied directly to the plurality of disc-type trapping units positioned at the lower side thereof. As a result, there is an advantage in that the gas is sequentially supplied and passes through the long flow path, such that the reaction by-products may be uniformly trapped by the structure-type trapping plates having the large surface area and the trapping disc.

In addition, according to the present disclosure, the heater having the dual structure, that is, the improved heat source and the introduced gas diffusion structure by the radially arranged diffuser is provided, the diffusion of the gas is provided by increasing a distance by which the heat reaches the upper end region in the trapping apparatus. As a result, there is an advantage in that the region having the uniform temperature is expanded, and the heated unreacted gas is supplied into the internal trapping tower at the uniform temperature and with the flow velocity, such that the flow velocity is decreased again, and the reaction by-products contained in the gas are trapped with high efficiency.

The present disclosure is a useful invention having many advantages as described above and is an invention that is highly expected to be used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of an exemplary embodiment of the present disclosure will be described in detail with reference to the accompanying drawings. In addition, in the description of the present disclosure, the specific descriptions of related well-known functions or configurations will be omitted when it is determined that the specific descriptions may unnecessarily obscure the subject matter of the present disclosure.

Figure 1:
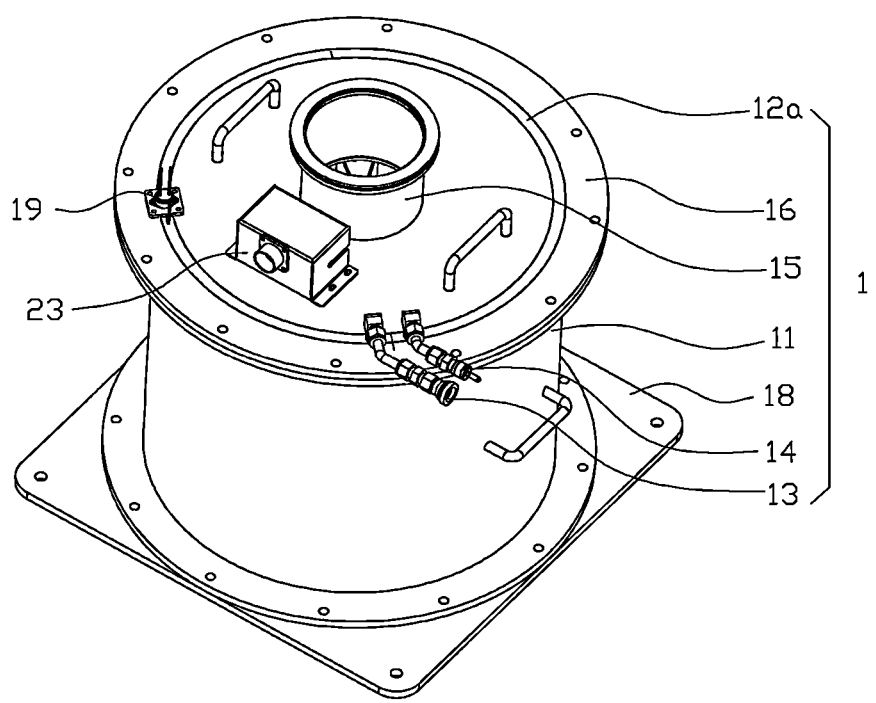
FIG. 1 is a perspective view illustrating a reaction by-product trapping apparatus according to an exemplary embodiment of the present disclosure.
Figure 2:
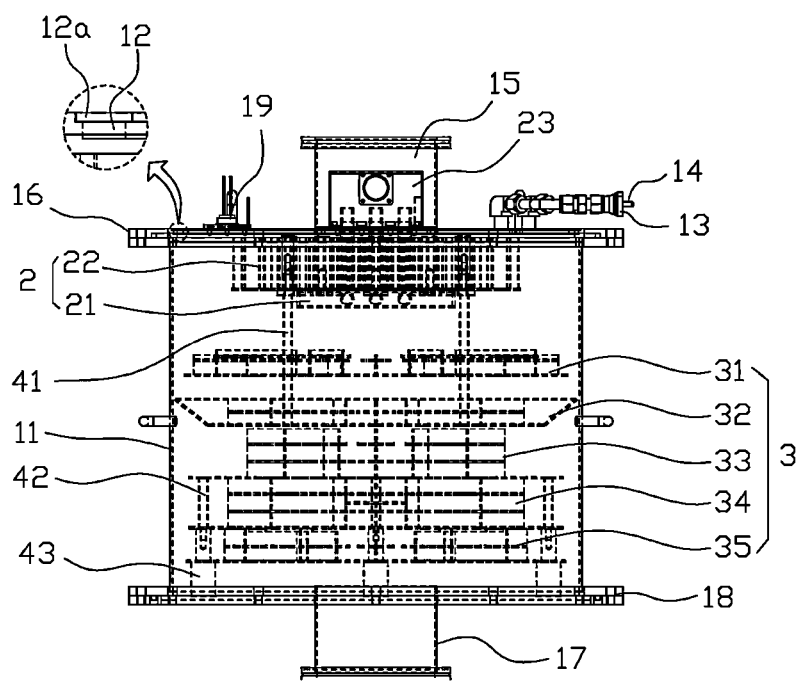
FIG. 2 is a cross-sectional view illustrating a structure of the reaction by-product trapping apparatus according to the exemplary embodiment of the present disclosure.
Figure 3:
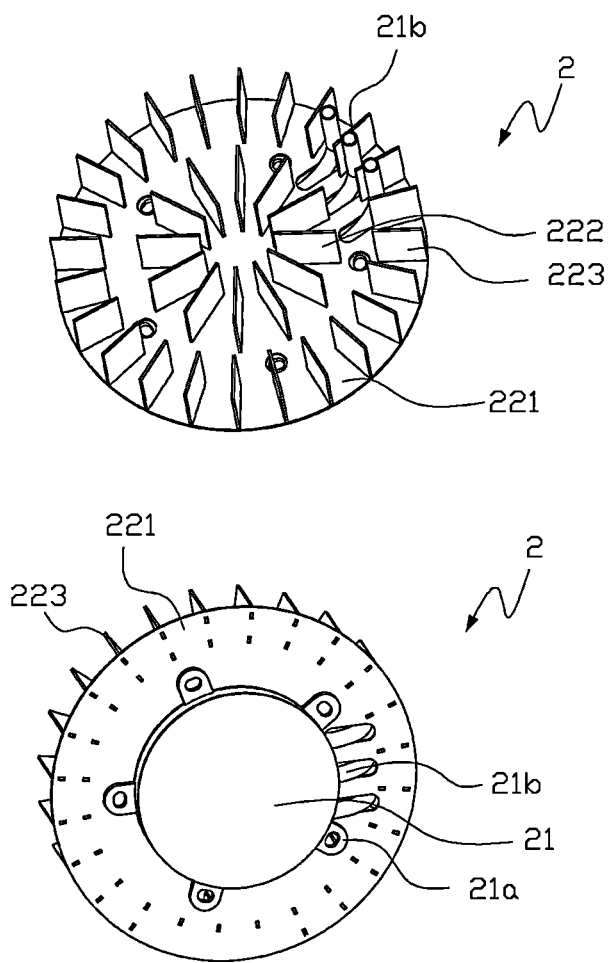
FIG. 3 is top and bottom perspective views illustrating a heater according to the exemplary embodiment of the present disclosure.
Figure 4:
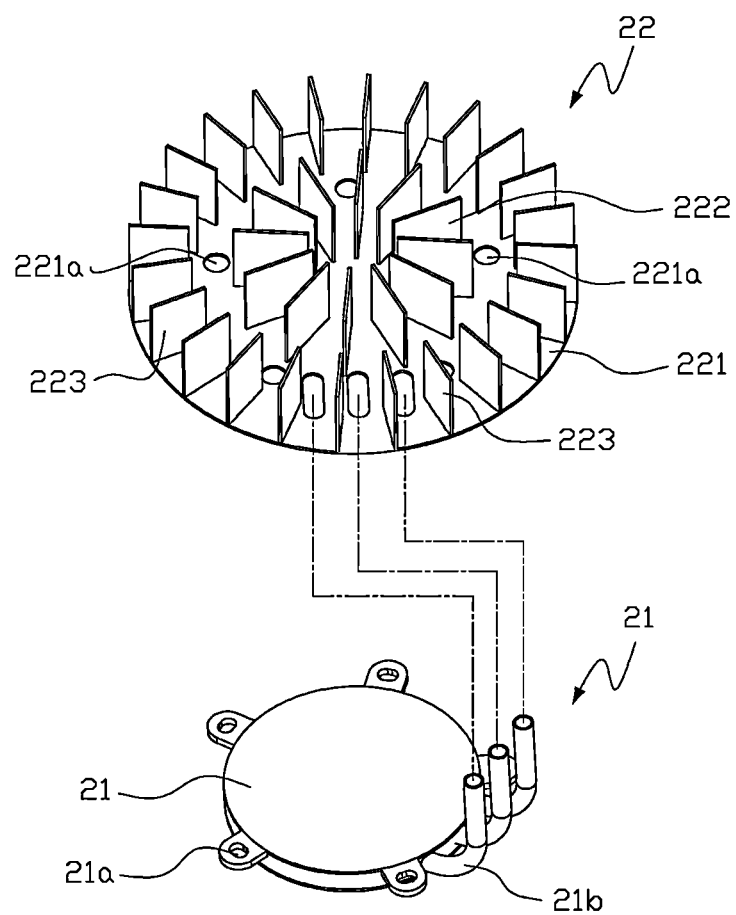
FIG. 4 is an exploded perspective view illustrating a configuration of the heater according to the exemplary embodiment of the present disclosure.
Figure 5:
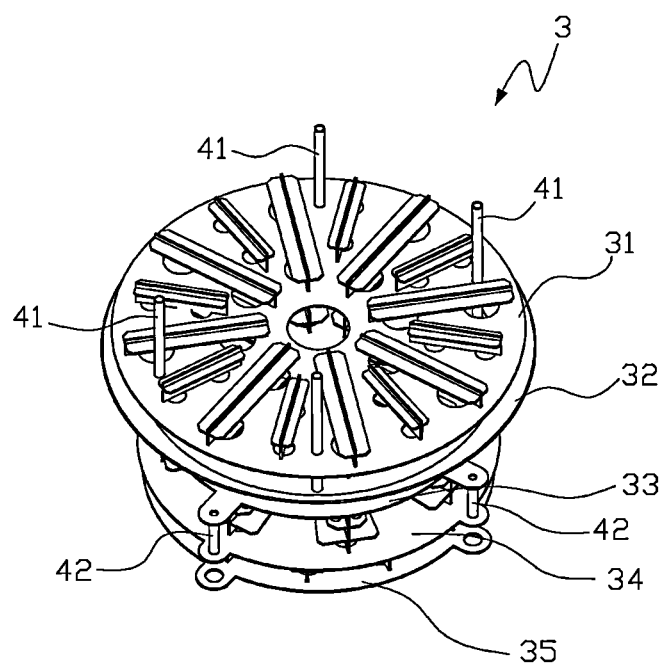
FIG. 5 is a perspective view illustrating an internal trapping tower according to the exemplary embodiment of the present disclosure.
Figure 6:
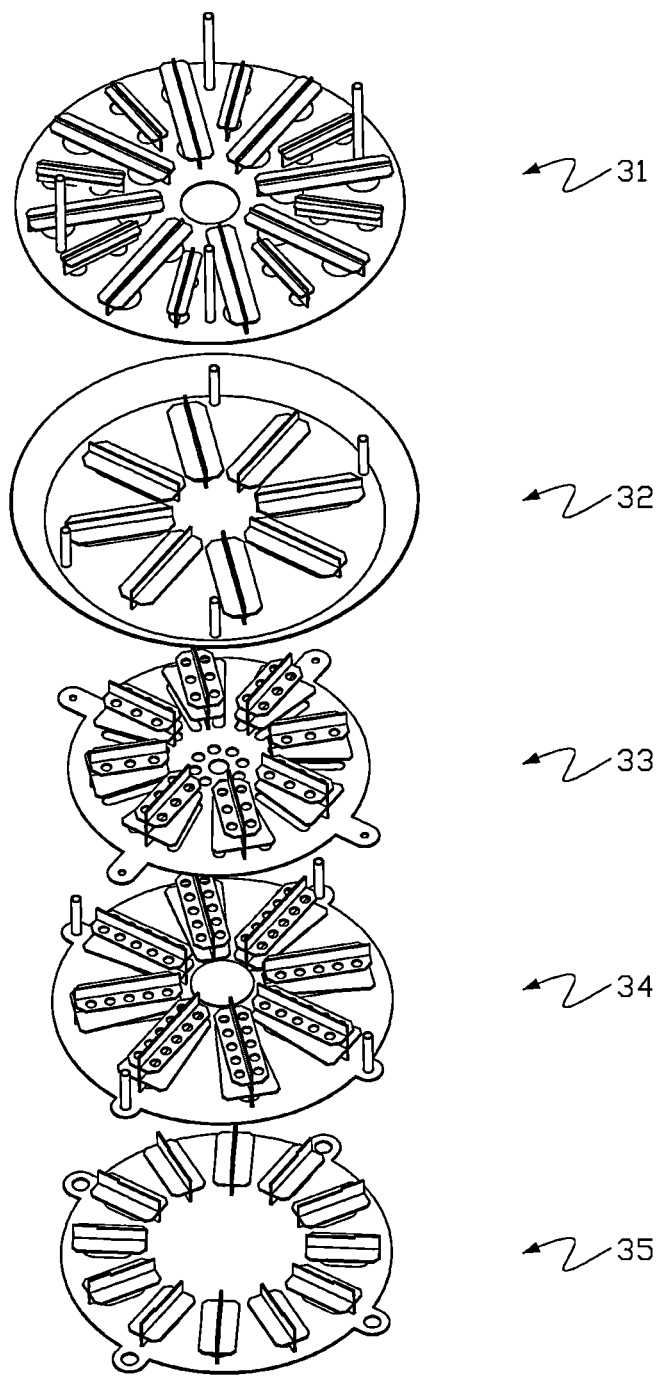
FIG. 6 is an exploded perspective view illustrating the internal trapping tower according to the exemplary embodiment of the present disclosure.
Figure 7:
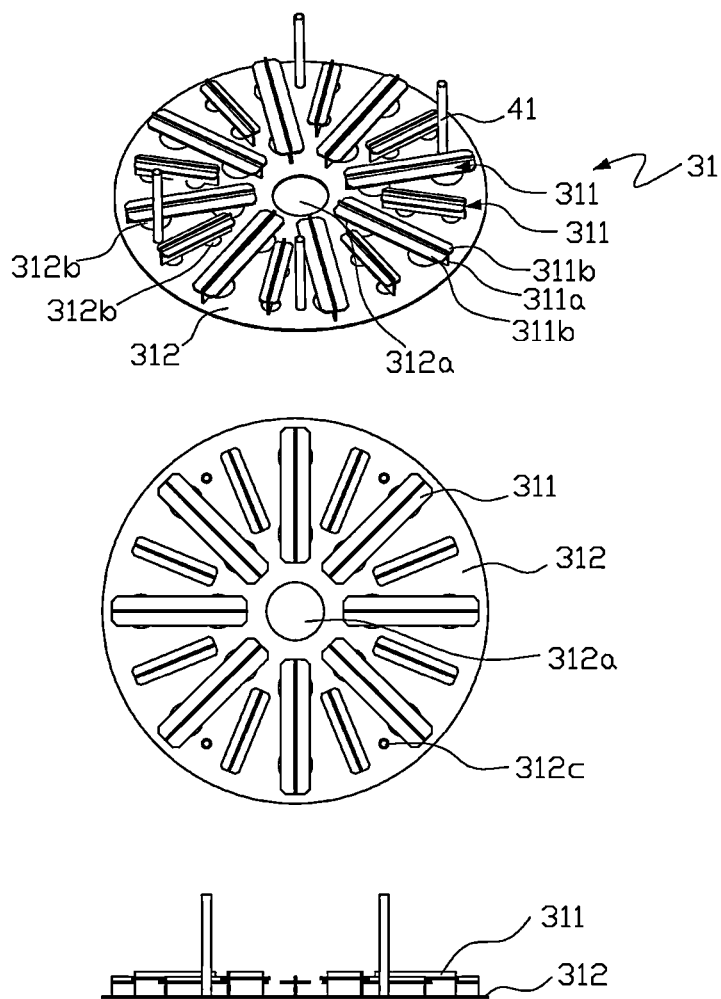
FIGS. 7 to 11 are exemplified views illustrating a configuration of a disc-type trapping unit constituting the internal trapping tower according to the exemplary embodiment of the present disclosure.
Figure 8:
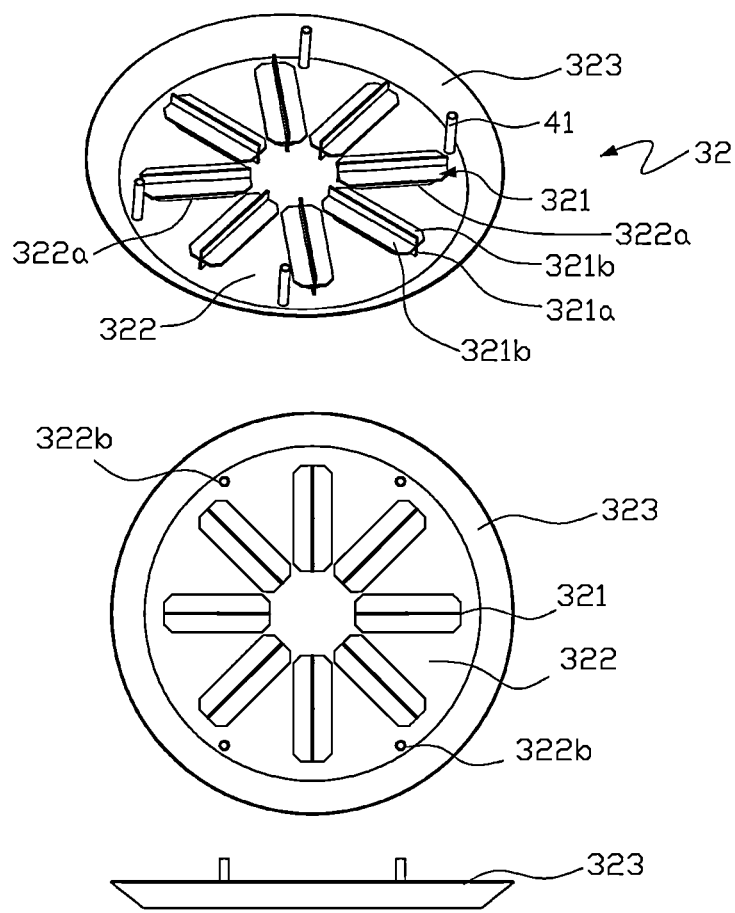
Figure 9:
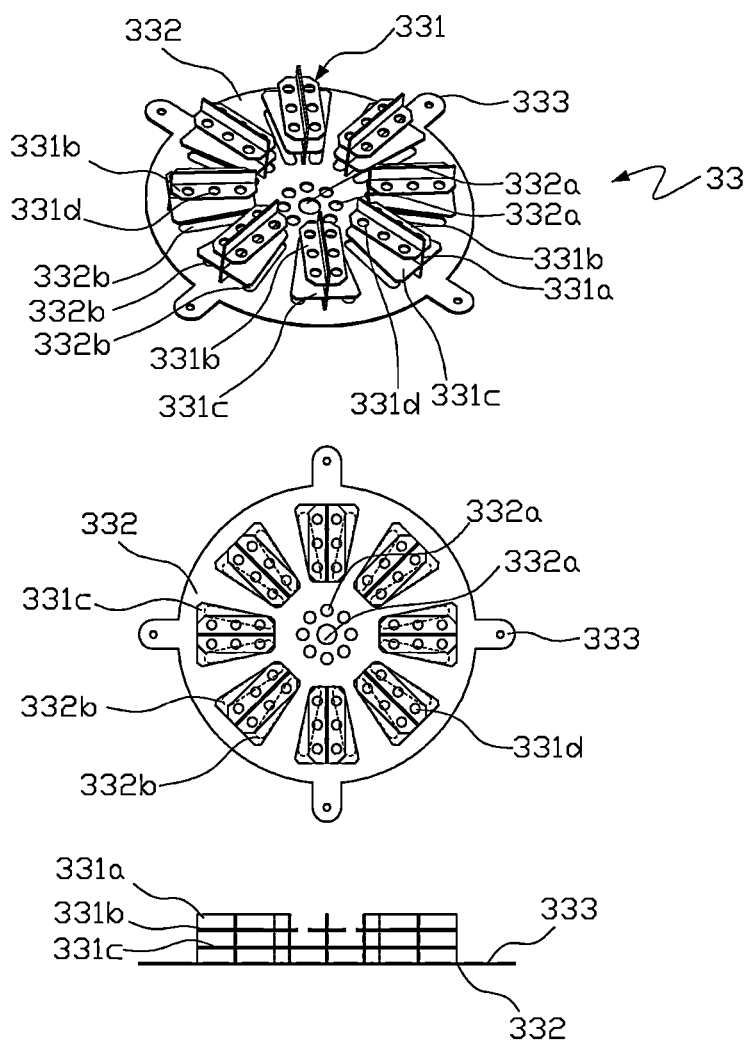
Figure 10:
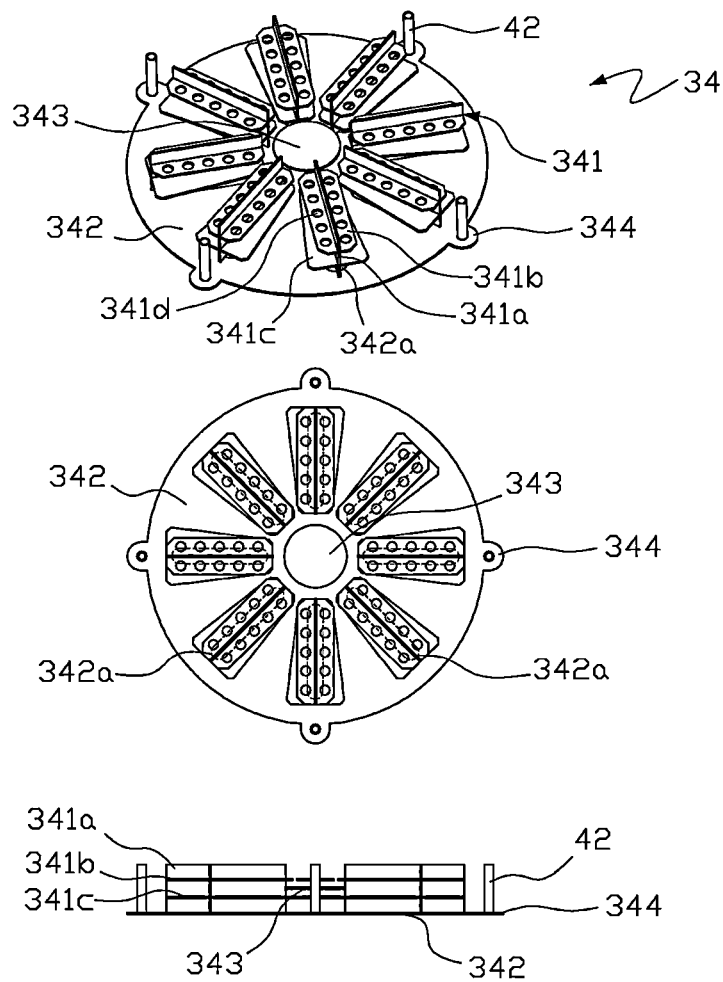
Figure 11:
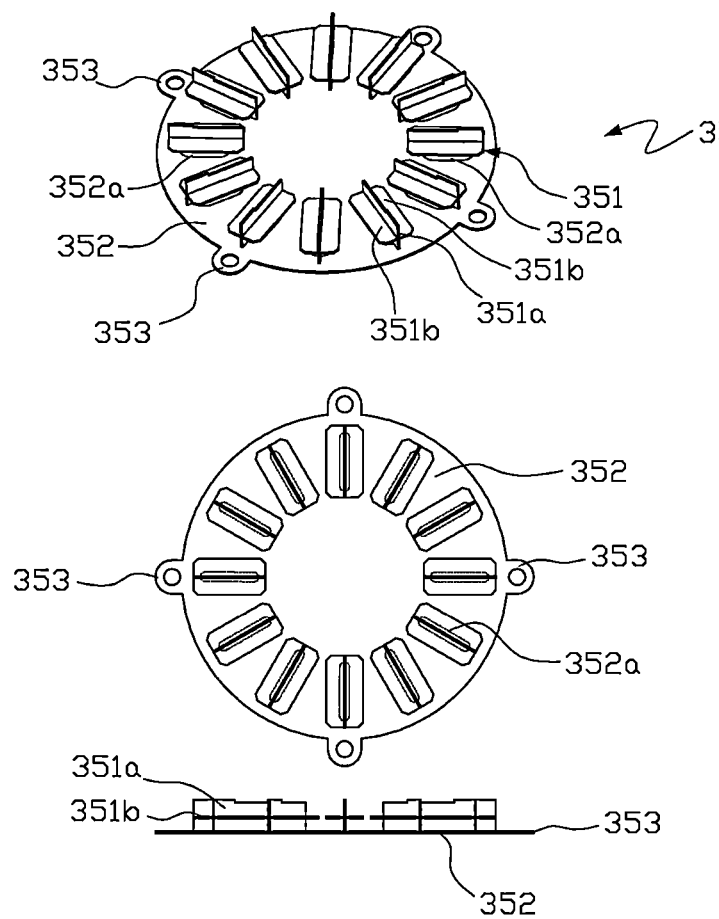

FIG. 1 is a perspective view illustrating a reaction by-product trapping apparatus according to an exemplary embodiment of the present disclosure, FIG. 2 is a cross-sectional view illustrating a structure of the reaction by-product trapping apparatus according to the exemplary embodiment of the present disclosure, FIG. 3 is top and bottom perspective views illustrating a heater according to the exemplary embodiment of the present disclosure, FIG. 4 is an exploded perspective view illustrating a configuration of the heater according to the exemplary embodiment of the present disclosure, FIG. 5 is a perspective view illustrating an internal trapping tower according to the exemplary embodiment of the present disclosure, FIG. 6 is an exploded perspective view illustrating the internal trapping tower according to the exemplary embodiment of the present disclosure, and FIGS. 7 to 11 are exemplified views illustrating a configuration of a disc-type trapping unit constituting the internal trapping tower according to the exemplary embodiment of the present disclosure.

As illustrated, an apparatus for trapping a reaction by-product produced during an organic film deposition process according to the present disclosure includes: a housing 1 configured to receive and discharge an introduced unreacted gas; a heater 2 having a structure in which heat of a heater main body 21 is uniformly transferred and the introduced gas is diffused by a diffuser 22 positioned at an upper side in the housing and having a dual structure arranged radially; and an internal trapping tower 3 in which a plurality of disc-type trapping units is vertically arranged in multiple layers, the plurality of disc-type trapping units including structure-type trapping plates and trapping discs, in which the structure-type trapping plates are installed in the housing, radially arranged, and have a large surface area per unit area in order to uniformly trap particulate reaction by-products in the form of a thin film while blocking and switching flow paths of the gases heated and diffused by the heater, and the trapping discs have exhaust holes arranged at a central portion thereof and arranged radially in order to concentrate the gas flows or uniformly disperse the gas flows and then discharge the gases.

The reaction by-product trapping apparatus refers to an apparatus that aggregates and traps the particulate reaction by-products contained in the unreacted gases discharged from a process chamber (not illustrated) during a semiconductor manufacturing process, and discharges only the remaining gases through a vacuum pump. In particular, the particulate reaction by-products are trapped by the internal trapping tower in which the disc-type trapping units are provided vertically in multiple layers, and each of the disc-type trapping units has a structure that reduces flow velocities of the gases and disperses the gases with uniform flow velocity and temperature distribution in order to trap the fine particulate reaction by-products, which are contained in the introduced unreacted gas discharged from the process chamber after an organic film deposition process is performed in the semiconductor manufacturing process, in the form of a thin film uniformly and with high efficiency.

The types of gases to be processed by the reaction by-product trapping apparatus according to the present disclosure include an unreacted gas discharged after an organic film deposition process is performed on a process gas such as 1,3-cyclo hexanebis (methylamine), a mixture of isomers, 1,3-bis (isocyanatomethyl) cyclo hexane, and the like in the process chamber. The particulate reaction by-products contained in the gases contain a finely small amount of particles and are not well trapped by the structure of the trapping apparatus, which is used in the related art, because of a difference in process gases and a difference in amount of usage. Only the trapping apparatus having the structure according to the present disclosure traps the particulate reaction by-products by reducing a flow velocity as much as possible, increasing a residence time, providing a uniform flow velocity and a temperature distribution for enabling the trapping, and providing a large surface area per unit area.

The trapping apparatus according to the present disclosure is manufactured using a material such as stainless steel or aluminum that may prevent corrosion of most components so as to prevent corrosion by the unreacted gas discharged from the process chamber.

The housing 1 includes: a housing main body 11 configured to receive the introduced unreacted gas; an upper plate 16 fastened to an upper portion of the housing main body and having a protective O-ring configured to maintain gas tightness or liquid tightness, a coolant inlet port 13 and a coolant discharge port 14 configured to supply and discharge a coolant to/from a coolant flow path 12 through which the coolant is supplied for maintaining an appropriate temperature when trapping the reaction by-products in a region below the upper plate, and a gas inlet port 15 through which the gas is introduced; and a lower plate 18 fastened to a lower portion of the housing main body and having a gas discharge port 17 through which the remaining gas containing the trapped particulate reaction by-products is discharged.

An inner wall of the housing main body 11, a bottom surface of the upper plate 16, and an upper surface of the lower plate 18 trap the particulate reaction by-products contained in the gas, like the internal trapping tower 3.

In particular, only an upper portion of the inner wall of the housing main body 11 concentratedly traps the particulate reaction by-products, and this is because a downward flow of the unreacted gas is slowed down at a certain point by the disc-type trapping unit to be described below.

The housing main body 11, the upper plate 16, and the lower plate 18 are illustrated as having a cylindrical shape or a circular plate shape according to the exemplary embodiment of the present disclosure, but the present disclosure is not limited only to the above-mentioned shapes, and the housing main body 11, the upper plate 16, and the lower plate 18 may of course have required shapes such as a quadrangular container shape or a quadrangular plate shape. However, for convenience of description, the present disclosure will be described below with reference to the drawings that illustrate the cylindrical shape or the circular plate shape.

The housing main body 11 has a vacant housing shape and serves to store the introduced gas so that the gas introduced into the internal trapping tower 3 installed in the housing main body 11 is aggregated and trapped. After the internal trapping tower 3 is received and installed, the upper portion of the housing main body 11 is covered by the upper plate 16 and fixed by well-known fastening means including bolts.

The upper plate 16 serves as a cover for covering an opened upper side of the housing main body 11 and is supplied with the unreacted gas discharged from the process chamber through the gas inlet port 15.

In addition, the coolant flow path 12 is formed in a groove shape in an upper surface of the upper plate 16, and the coolant flow path 12 provides an appropriate temperature range when trapping the reaction by-products and prevents a deterioration in function such as deformation of the non-illustrated O-ring installed on the lower portion of the upper plate when an internal space of the housing main body 11 is heated as the heater 2 installed on the bottom surface of the upper plate 16 operates. An upper side of the coolant flow path formed as a groove is covered by a flow path cover 12a. In this case, although not illustrated, the flow path cover may be fastened by sealing for liquid tightness, and well-known fastening methods such as fitting, welding, and bolting may be applied.

The coolant flow path 12 is configured such that the coolant supplied from an external coolant tank (not illustrated) is introduced through the coolant inlet port 13 and then circulated and discharged through the coolant discharge port 14. The adjacent parts of the coolant flow path between the coolant inlet port 13 and the coolant discharge port 14 have a boundary portion without communicating with each other so that the introduced coolant and the coolant to be discharged are not mixed. Water or a refrigerant may be used as the coolant.

A space portion in a region in which the coolant flow path 12 is a space portion corresponding to a circumference of an upper region of the internal trapping tower 3, and the space portion adjusts a high temperature of gas, which is heated by the heater, diffused by the diffuser, and supplied into the region, to a temperature range for enabling the trapping of the reaction by-products.

In addition, the gas inlet port 15 is fixed by welding after forming a hole in the upper plate and may be installed at various points but particularly installed at a central portion of the upper plate.

In addition, a heater power supply unit 23 is installed on the upper plate 16 to supply power to the heater 2 installed on the bottom surface of the upper plate. To this end, a temperature sensor 19 is provided on the upper plate to check a temperature of the coolant flow path of the trapping apparatus.

The lower plate 18 serves as a cover for covering an opened lower side of the housing main body 11. The gas discharge port 17 is fixed by welding to a certain point, particularly, a central portion of the lower plate 18 after forming a hole in the lower plate 18 and used as a passageway through which the unreacted gas from which the reaction by-products have been removed is discharged.

The heater 2 is positioned and installed at the upper side in the housing 1 and includes: the heater main body 21 configured to generate heat when the power is applied from the heater power supply unit 23; and the diffuser 22 fastened to an upper surface of the heater main body and having a dual structure arranged multiple times for supplying uniformly transferred heat to the gas and diffusing the gas. The heater serves to adjust the temperature of the introduced gas to a range for enabling the trapping and diffuse the gas by means of the diffuser.

The diffuser 22 includes: a thermally conductive diffuser plate 221 having a larger diameter than the upper surface of the heater main body and configured to transfer heat to a region wider than a region of the heater main body; a plurality of inner vertical diffuser plates 222 radially arranged in a circular shape at a central portion of the thermally conductive diffuser plate 221 and configured to uniformly diffuse the introduced unreacted gas in a horizontal direction while uniformly supplying heat; and a plurality of outer vertical diffuser plates 223 radially arranged in a circular shape around the inner diffuser plates 222 radially arranged in a circular shape on the thermally conductive diffuser plate 221, the plurality of outer vertical diffuser plates 223 being configured to subdivide and diffuse the uniformly diffused gas in the horizontal direction while further subdividing and uniformly supplying the heat.

The number of outer diffuser plates 223 is configured such that an angle at which the outer diffuser plates 223 are radially arranged is at least about half an angle at which the inner diffuser plates 222 are radially arranged. That is, the outer diffuser plates are disposed at outer peripheral points at an angle equal to the angle at which the inner diffuser plates 222 are radially arranged, and the outer diffuser plates are further disposed between the radially arranged inner diffuser plates 222, such that the heat diffused at a predetermined angle from the inside is further diffused at a further subdivided angle while being transferred to the outer periphery, and as a result, the heat subdivides and diffuses the unreacted gas in the horizontal direction while uniformly heating the unreacted gas.

A protruding portion may be formed on a lower portion of each of the inner diffuser plates 222 and the outer diffuser plates 223 so as to be fitted into and coupled to each of the grooves formed in the thermally conductive diffuser plate 221. Further, the inner diffuser plates 222 and the outer diffuser plates 223 may be vertically installed by a method such as welding.

The heater 2 is attached and installed by a fastening method such as bolting or welding so as to be adjacent to a lower side of the gas inlet port 15 provided on the upper plate 16. To this end, a plurality of fastening parts 21a is arranged around the upper surface of the heater main body 21, and screws penetrate a plurality of fastening holes 221a formed in the thermally conductive diffuser plate 221 disposed above and facing the heater main body 21 and are inserted into fastening parts protruding downward from the bottom surface of the upper plate, such that the heater 2 is fastened to the lower portion of the upper plate.

When power is applied to the heater power supply unit 23 installed on the upper surface of the upper plate 16 and connected with heat transfer tubes (or heat transfer wires) 21b, the heater 2 generates heat at a predetermined temperature. A material such as ceramic or Inconel is used as the material of the heater 2 in order to prevent corrosion caused by the introduced gas. In this case, a plurality of holes is formed in the thermally conductive diffuser plate 221 in order to install the heat transfer tubes.

The heater 2 configured as described above allows the unreacted gas discharged from the process chamber to maximally aggregate when the unreacted gas reaches the internal trapping tower 3 while preventing the unreacted gas from aggregating when the unreacted gas is introduced through the gas inlet port 15 provided on the upper plate 16, thereby preventing the gas inlet port 15 from being clogged. Further, the heater 2 includes the inner diffuser plates 222 and the outer diffuser plates 223, which define the radially disposed dual structures, such that the gas, which has received heat from the heater main body and has been uniformly and finely diffused to a portion further distant from the heater main body in the housing, is subdivided and diffused in the horizontal direction, and as a result, a uniform temperature range is formed around an upper space in the housing, such that the uniform heat and gas are supplied to the upper space of the internal trapping tower 3 so that the gas is uniformly aggregated.

In addition, when the uniform temperature range is formed around the upper portion in the housing as described above, the upper portion of the inner wall of the housing main body 11 traps the reaction by-products contained in the unreacted gas. The reason why only the upper portion of the inner wall of the housing main body 11 traps the reaction by-products is that the downward flow of the unreacted gas is slowed down at a certain point by the disc-type trapping unit to be described below.

The plurality of disc-type trapping units of the internal trapping tower 3 is vertically arranged in multiple layers and uniformly traps the particulate reaction by-products in the form of a thin film by blocking and changing the flow paths of the gas supplied by the diffuser 22 of the heater 2 positioned at the upper side and diffused at a temperature for enabling the trapping.

In a basic structure of the plurality of disc-type trapping units, the structure-type trapping plates having a cross-shaped section or a dual cross-shaped section are radially arranged to implement a uniform vortex generating structure for increasing a large surface area per unit area and a trapping time for trapping the reaction by-products, and the trapping disc has the exhaust holes disposed at a central portion or arranged radially in order to concentrate the flow of gas or uniformly disperse and discharge the gas.

In addition, an inclined guide is disposed around the trapping disc of the disc-type trapping unit, which is positioned at the upper side among the disc-type trapping units and positioned adjacent to an inner diameter of the housing main body 11. The inclined guide is formed to be inclined downward, such that the gas uniformly supplied from the uppermost disc-type trapping unit is concentrated and collected inside the inclined guide and then supplied to the disc-type trapping unit positioned at the lower side thereof instead of being supplied directly to the plurality of disc-type trapping units positioned at the lower side.

The structure-type trapping plate is configured to be fixed to the trapping disc by fitting or welding.

Specific structures of the respective disc-type trapping units, which share the basic structure as described above, have different shapes for each layer. Hereinafter, the respective structures will be specifically described.

The disc-type trapping units according to the exemplary embodiment of the present disclosure are installed to have space portions spaced apart from one another at predetermined intervals in the order of a first disc-type trapping unit 31, a second disc-type trapping unit 32, a third disc-type trapping unit 33, a fourth disc-type trapping unit 34, and a fifth disc-type trapping unit 35 from the upper side.

The plurality of disc-type trapping units may be integrally fastened. However, in the exemplary embodiment of the present disclosure, the first disc-type trapping unit 31 and the second disc-type trapping unit 32 are fastened to the upper plate of the housing by means of support members 41 such that the first disc-type trapping unit 31 and the second disc-type trapping unit 32 is fixed and spaced apart from each other at a predetermined interval while hanging on the upper plate. The third disc-type trapping unit 33, the fourth disc-type trapping unit 34, and the fifth disc-type trapping unit 35 are fastened to the lower plate of the housing by means of support members 42 and 43 and fixed and spaced apart from each other at a predetermined interval (height). The structures fixed as described above are advantageous in stably fixing the disc-type trapping units and allowing the disc-type trapping units to be less affected by the influence of the flow that occurs when the gas is introduced and discharged.

The first disc-type trapping unit 31 guides the flow of gas, which is diffused multiple times toward the inner wall of the housing by the diffuser 22 of the heater 2 and then supplied to the lower portion, to the central portion by means of a plurality of structure-type trapping plates 311 arranged radially, uniformly discharges the gas to the lower side through central exhaust holes 312a and a plurality of radially arranged circular-hole-type exhaust holes 312b formed in a trapping disc 312, and uniformly traps the reaction by-products in the form of a thin film by means of the structure-type trapping plates 311 and the trapping disc 312.

The plurality of radially arranged structure-type trapping plates 311 includes the large and long structure-type trapping plates 311 and the small, low, and short structure-type trapping plates 311 which are alternately installed.

Therefore, the number of structure-type trapping plates 311 provided on the first disc-type trapping unit 31 is larger than the number of structure-type trapping plates provided on the second to fifth disc-type trapping units 32, 33, 34, and 35 positioned below the first disc-type trapping unit 31, such that the gas is further subdivided and distributed uniformly to the lower side.

With the above-mentioned configuration, efficiency in generating vortexes of lowered gas is improved, and trapping efficiency is improved as the flow of gas is slowed down.

In addition, the structure-type trapping plate 311 has a vertical plate 311a and a horizontal plate 311b that divides the vertical plate 311a into two portions, such that a cross section of the structure-type trapping plate 311 has a cross shape, thereby increasing a trapping area per unit area.

The structure-type trapping plate 311 having the above-mentioned structure allows the gas lowered from the upper side to collide with the structure-type trapping plate 311 to generate vortexes and reduce the flow velocity and then be supplied in a lateral direction, such that the structure-type trapping plate 311 performs the trapping operation while guiding the flow of gas in the longitudinal direction.

The central exhaust hole 312a is formed in the central portion of the trapping disc 312 to which the structure-type trapping plates 311 do not extend, such that no interference occurs. The central exhaust hole 312a is formed to provide the operation of mainly discharging the gas.

In addition, the plurality of radially arranged circular-hole-type exhaust holes 312b is formed in the trapping disc 312 at the lower side so that one or more circular-hole-type exhaust holes 312b are formed at each position at which the structure-type trapping plate 311 is installed, and the plurality of radially arranged circular-hole-type exhaust holes 312b is formed to provide the operation of auxiliarily discharging the gas.

In this case, the large circular-hole-type exhaust hole 312b is formed for the large and long structure-type trapping plate 311, and the small circular-hole-type exhaust hole 312b is formed for the small and short structure-type trapping plate 311.

Meanwhile, a plurality of holes 312c is formed in the trapping disc 312 of the first disc-type trapping unit 31, such that the support members 41 are installed on the upper plate through the plurality of holes 312c. A fully threaded bolt fixed to the upper plate is inserted into the support member and then penetrates even the support member 41 positioned on the second disc-type trapping unit 32 to fasten the upper plate, the first disc-type trapping unit, and the second disc-type trapping unit 32, such that the first disc-type trapping unit 31 hangs on the upper plate.

The second disc-type trapping unit 32 is configured such that a plurality of radially arranged structure-type trapping plates 321 guides outward the flow of gas supplied downward from the first disc-type trapping unit 31, an inclined guide 323 formed around a trapping disc 322 blocks the flow of gas supplied from the upper or lateral side, collects the gas, and slows down the flow of gas, the gas is uniformly discharged downward through long-hole-type exhaust holes 322a radially arranged in the trapping disc 322 at the lower side along the radially arranged structure-type trapping plates 321, and the structure-type trapping plates 321 and the trapping disc 322 uniformly trap the reaction by-products in the form of a thin film. In this case, a length of the long-hole-type exhaust hole 322a is set such that the long-hole-type exhaust hole 322a is formed along the structure-type trapping plate 321 from the peripheral portion to a portion nearly in the vicinity of the central portion, such that the gas is uniformly supplied downward.

The inclined guide 322, which is formed like a wall around the trapping disc, is positioned adjacent to an inner diameter of the housing main body 11 or positioned to face the inner diameter of the housing main body 11. The inclined guide 322 is formed to be inclined downward, such that the gas uniformly supplied from the first disc-type trapping unit 31 at the uppermost side, is concentrated and collected inside the inclined guide and then supplied to the disc-type trapping unit positioned at the lower side thereof instead of being supplied directly to the plurality of disc-type trapping units positioned at the lower side. With the above-mentioned configuration, the gas is collected at the upper side while the overall flow velocity of the entire gas is decreased, and then the gas is stably supplied to the lower side, thereby improving trapping efficiency.

The number of structure-type trapping plates 321 provided on the second disc-type trapping unit 32 is smaller than the number of structure-type trapping plates provided on the first disc-type trapping unit 31, such that an area of a spacing portion is large, and the lowered gases are mixed well to make a temperature uniform. This slows down the flow of gas, thereby improving trapping efficiency.

In addition, the structure-type trapping plate 321 has a vertical plate 321a and a horizontal plate 321b that divides the vertical plate 311a into two portions, such that a cross section of the structure-type trapping plate 311 has a cross shape, thereby increasing a trapping area per unit area.

The structure-type trapping plate 321 having the above-mentioned structure allows the gas lowered from the upper side to collide with the structure-type trapping plate 321 to generate vortexes and reduce the flow velocity and then be supplied in a lateral direction, such that the structure-type trapping plate 321 performs the trapping operation while guiding the flow of gas in the longitudinal direction.

No exhaust hole is formed in the central portion of the trapping disc 322, such that the gas is discharged only through the radially arranged long-hole-type exhaust holes 322a provided at the points on the lower trapping disc 312 at which the structure-type trapping plates 321 are installed, like the structure-type trapping plates 321.

Meanwhile, a plurality of holes 322b is formed in the trapping disc 322 of the second disc-type trapping unit 32, such that the support members 41 are installed on the upper plate. The fully threaded bolt fixed to the upper plate is inserted into the support member and then penetrates even the support member 41 positioned on the upper first disc-type trapping unit 31 to fasten the upper plate, the first disc-type trapping unit, and the second disc-type trapping unit, such that the second disc-type trapping unit 32 hangs on the upper plate.

The third disc-type trapping unit 33 is configured such that a plurality of radially arranged dual structure-type trapping plates 331 discharges the gas, which is supplied downward from the second disc-type trapping unit 32, downward in an outward direction of the trapping disc 332, the gas is uniformly discharged downward through a plurality of exhaust holes 332a formed in a central portion of the lower trapping disc 332 and long-hole-type exhaust holes 332b arranged radially, and the dual structure-type trapping plates 331 and the trapping disc 332 uniformly trap the reaction by-products in the form of a thin film.

In this case, a length of the long-hole-type exhaust hole 332b is set such that the long-hole-type exhaust hole 332b is formed along the long dual structure-type trapping plate 331 within a large region to a portion in the vicinity of the central portion, such that the gas is uniformly supplied downward.

In addition, the two long-hole-type exhaust holes 332b are formed for one dual structure-type trapping plate 331, thereby improving exhaust efficiency.

In addition, the dual structure-type trapping plates 331 provided in the third disc-type trapping unit 33 are equal in number to the structure-type trapping plates provided on the second disc-type trapping unit 32. The dual structure-type trapping plates 331 are radially arranged at the same angle at the lower side thereof, such that the lowered gas collides with the dual structure-type trapping plates 331 to form a vortex region. Therefore, the time for which the gas stagnates is increased, and the increased amount of gases are mixed again to make the temperature uniform, thereby improving trapping efficiency.

In addition, the dual structure-type trapping plate 331 has a vertical plate 331a and first and second horizontal plates 331b and 331c that divide the vertical plate 331a into two portions, such that a cross section of the dual structure-type trapping plate 331 has a dual cross shape, thereby further increasing a trapping area per unit area.

However, because the approach of the gas to the second horizontal plate 331c positioned at the lower side is decreased by the first horizontal plate 331b positioned at the upper side, exhaust holes 331d are formed in the longitudinal direction in the first horizontal plate 331b, such that the gas is smoothly supplied to the lower second horizontal plate 331c.

In addition, the second horizontal plate 331c positioned at the lower side has a larger cross-sectional area than the first horizontal plate 331b positioned at the upper side, thus has a large trapping area, and has a rhombic shape having a width that increases outward from the central portion of the trapping disc 332, thereby increasing the trapping area.

The dual structure-type trapping plate 331 having the above-mentioned structure allows the unreacted gas lowered from the upper side to collide with the dual structure-type trapping plate 331 to generate vortexes and reduce the flow velocity and then be supplied in a lateral direction, such that the dual structure-type trapping plate 331 performs the trapping operation while guiding the flow of unreacted gas in the longitudinal direction.

The unreacted gas, which has undergone the trapping operation, is discharged through the central exhaust holes 332a formed in the central portion of the trapping disc 332 and the radially arranged long-hole-type exhaust holes 332b provided at the points on the lower trapping disc 332 at which the dual structure-type trapping plates 331 are installed, like the dual structure-type trapping plates 331.

Meanwhile, a plurality of fastening parts 333 protrudes in the horizontal direction around the trapping disc 332 of the third disc-type trapping unit 33, and the support members 42 for connecting fastening parts provided on the fourth disc-type trapping unit 34 are installed. The support member 42 and an inner portion of a main support member 43, which penetrates the fifth disc-type trapping unit 35 and is fixedly installed on the lower plate, are fastened and fixed by the fully threaded bolt.

The fourth disc-type trapping unit 34 is configured such that a plurality of radially arranged dual structure-type trapping plates 341 discharges the gas, which is supplied downward from the third disc-type trapping unit 33, downward in the outward direction of the trapping disc 342, the gas is uniformly discharged through long-hole-type exhaust holes 342a radially arranged on the lower trapping disc 342, and the dual structure-type trapping plates 341 and the trapping disc 342 uniformly trap the reaction by-products in the form of a thin film.

In this case, a circular exhaust plate 343 is formed to be spaced apart upward from the central portion of the trapping disc 342 at a predetermined distance, such that the lowered gas collides with the circular exhaust plate 343, thereby improving lateral exhaust efficiency through the dual structure-type trapping plates 341.

A length of the long-hole-type exhaust hole 342a is set such that the long-hole-type exhaust hole 342a is formed along the long dual structure-type trapping plate 341 within a large region to a portion in the vicinity of the central portion, such that the gas is uniformly discharged downward after the trapping process.

The dual structure-type trapping plate 341 has a vertical plate 341a and first and second horizontal plates 341b and 341c that divide the vertical plate 341a into two portions, such that a cross section of the dual structure-type trapping plate 341 has a dual cross shape, thereby further increasing a trapping area per unit area.

However, because the approach of the gas to the second horizontal plate 341c positioned at the lower side is decreased by the first horizontal plate 341b positioned at the upper side, exhaust holes 341d are formed in the longitudinal direction in the first horizontal plate 341b, such that the gas is smoothly supplied to the lower second horizontal plate 341c.

In addition, the second horizontal plate 341c positioned at the lower side has a larger cross-sectional area than the first horizontal plate 341b positioned at the upper side, thus has a large trapping area, and has a rhombic shape having a width that increases outward from the central portion of the trapping disc 342, thereby increasing the trapping area.

The dual structure-type trapping plate 341 having the above-mentioned structure allows the gas lowered from the upper side to collide with the dual structure-type trapping plate 341 to generate vortexes and reduce the flow velocity and then be supplied in the lateral direction, such that the dual structure-type trapping plate 341 performs the trapping operation while guiding the flow of gas in the longitudinal direction.

Since the circular exhaust plate 343 is provided in the central portion of the trapping disc 342, the gas is mainly discharged through the radially arranged long-hole-type exhaust holes 342a provided at the points on the lower trapping disc 342 at which the dual structure-type trapping plates 341 are installed, like the dual structure-type trapping plates 341.

Meanwhile, a plurality of fastening parts 344 is provided around the trapping disc 342 of the fourth disc-type trapping unit 34, such that when the support member 42 is positioned, the main support member 43 fixedly installed on the lower plate and the fastening part formed on the third disc-type trapping unit 33 are fastened and fixed by the fully threaded bolt.

The fifth disc-type trapping unit 35 is configured such that a plurality of radially arranged structure-type trapping plates 351 guides the gas, which is supplied downward from the fourth disc-type trapping unit 34, outward, the gas is uniformly discharged downward through long-hole-type exhaust holes 352a radially arranged on a lower trapping disc 352 along the radially arranged structure-type trapping plates 351, and the structure-type trapping plates 351 and the trapping disc 352 uniformly trap the reaction by-products in the form of a thin film.

In this case, a length of the long-hole-type exhaust hole 352a is set such that the long-hole-type exhaust hole 352a is formed along the short structure-type trapping plate 351 within a small region to a peripheral portion distant from the center, such that the gas is uniformly supplied downward.

The number of structure-type trapping plates 351 provided on the fifth disc-type trapping unit 35 is relatively larger than the number of dual structure-type trapping plates provided on the fourth disc-type trapping unit 34, such that the lowered gas forms vortex regions at more points. In addition, the length of the long-hole-type exhaust hole 352a is decreased, a region in which the gas is discharged is relatively decreased, the time for which the gas stagnates is increased, and the increased amount of gases are mixed again finally to make the temperature uniform. This slows down the flow of gas, thereby improving trapping efficiency.

In addition, the structure-type trapping plate 351 has a vertical plate 351a and a horizontal plate 351b that divides the vertical plate 351a into two portions, such that a cross section of the structure-type trapping plate 351 has a cross shape, thereby increasing a trapping area per unit area.

The structure-type trapping plate 351 having the above-mentioned structure allows the gas lowered from the upper side to collide with the structure-type trapping plate 351 to generate vortexes and reduce the flow velocity and then be supplied in the lateral direction, such that the structure-type trapping plate 351 performs the trapping operation while guiding the flow of gas in the longitudinal direction.

An area in which no exhaust hole is formed in the central portion of the trapping disc 352 is larger than that of the trapping disc 342 of the fourth disc-type trapping unit 34, such that the gas is discharged only through the radially arranged long-hole-type exhaust holes 352a provided at the points on the lower trapping disc 352 at which the structure-type trapping plates 351 are installed, like the structure-type trapping plates 351. After the reaction by-product trapping process, the unreacted gas discharged through the outer circumference of the lateral side is discharged through the gas discharge port 17 provided on the central portion of the lower plate.

With this configuration, the central portion of the fifth disc-type trapping unit 35 is blocked and communicates with the gas discharge port 17, thereby preventing a lower outflow caused by the gas discharged.

Meanwhile, a plurality of fastening parts 353 is formed around the trapping disc 352 of the fifth disc-type trapping unit 35, and the support members 42 for connecting the fastening parts provided on the fourth disc-type trapping unit 34 are installed. The support member 42 and the inner portion of the main support member 43, which penetrates the fifth disc-type trapping unit 35 and is fixedly installed on the lower plate, are fastened and fixed by the fully threaded bolt.

According to the reaction by-product trapping apparatus according to the present disclosure configured as described above, when the unreacted gas discharged from the process chamber is supplied into the housing main body 11 through the gas inlet port 15 installed on the upper plate 16 of the housing 1, the gas is diffused multiple times while passing through the inner diffuser plates 222 and the outer diffuser plates 223 of the diffuser 22 by heated by the heater 2, the gas flows toward the inner wall of the housing main body and has a uniform flow velocity, and the gas is supplied at a temperature relatively lower than a high temperature at a dead zone under the heater main body 21 that generates heat when power is applied. In this case, the temperature of the unreacted gas, which flows toward the inner wall of the housing main body by the coolant flow path 12 formed on the upper plate, reaches a temperature for enabling the trapping of the reaction by-products. For this reason, the reaction by-products are also trapped in the region above the bottom surface of the upper plate and the inner wall of the housing main body 11.

Thereafter, the unreacted gas, which is diffused to have a uniform flow velocity and a reduced temperature, is lowered downward in a circumferential direction of the housing main body 11 and introduced through the upper circumference of the internal trapping tower 3. Thereafter, while the gas sequentially and vertically passes through the first to fifth disc-type trapping units each having structure-type trapping plates having the large surface area, the inclined guide blocks the flow path of the gas and concentrates the gas on the central portion, or the structure-type trapping plates and the exhaust holes for generating vortexes are used to diffuse the gas inward or outward and discharge the gas downward to decrease the flow velocity of the gas and increase the residence time, such that the temperature range for enabling the trapping is formed, and as a result, fine particulate reaction by-products contained in the unreacted gas, which is discharged after an organic film deposition process, among semiconductor manufacturing processes, is performed in the process chamber, are uniformly trapped in the form of a thin film.

Figure 12:
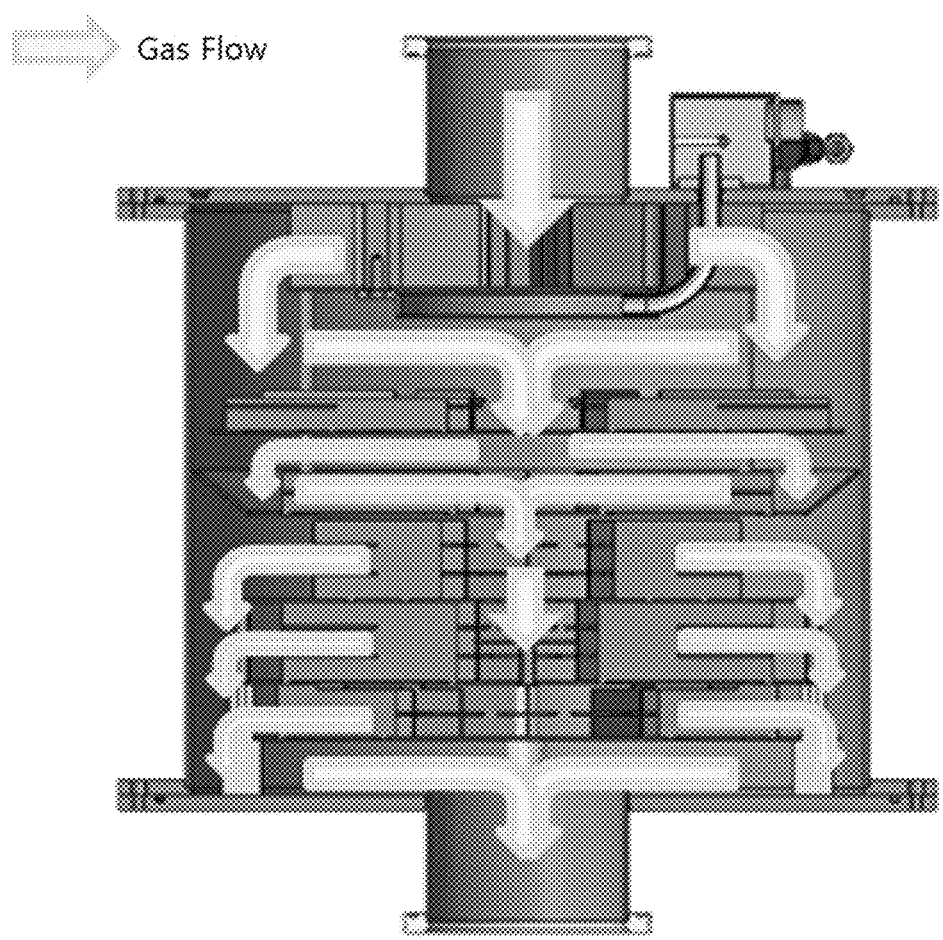
FIG. 12 is an exemplified view illustrating a gas flow in the reaction by-product trapping apparatus according to the exemplary embodiment of the present disclosure.
Figure 13:
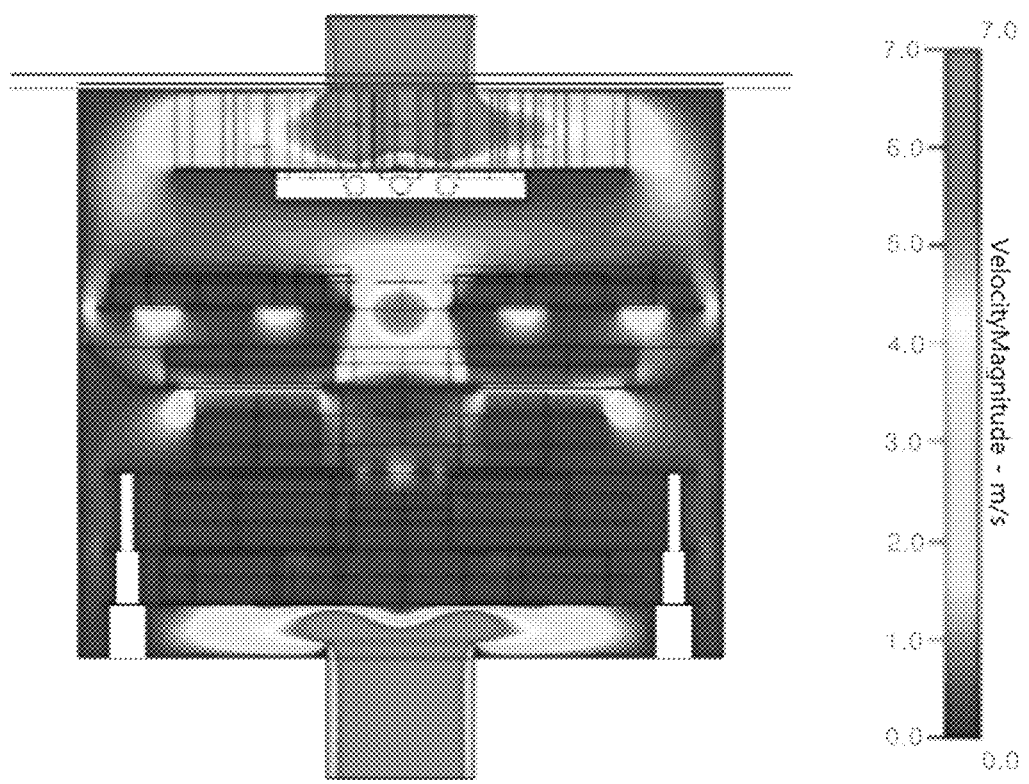
FIG. 13 is a view illustrating a flow velocity pattern in the reaction by-product trapping apparatus according to the exemplary embodiment of the present disclosure.
Figure 14:
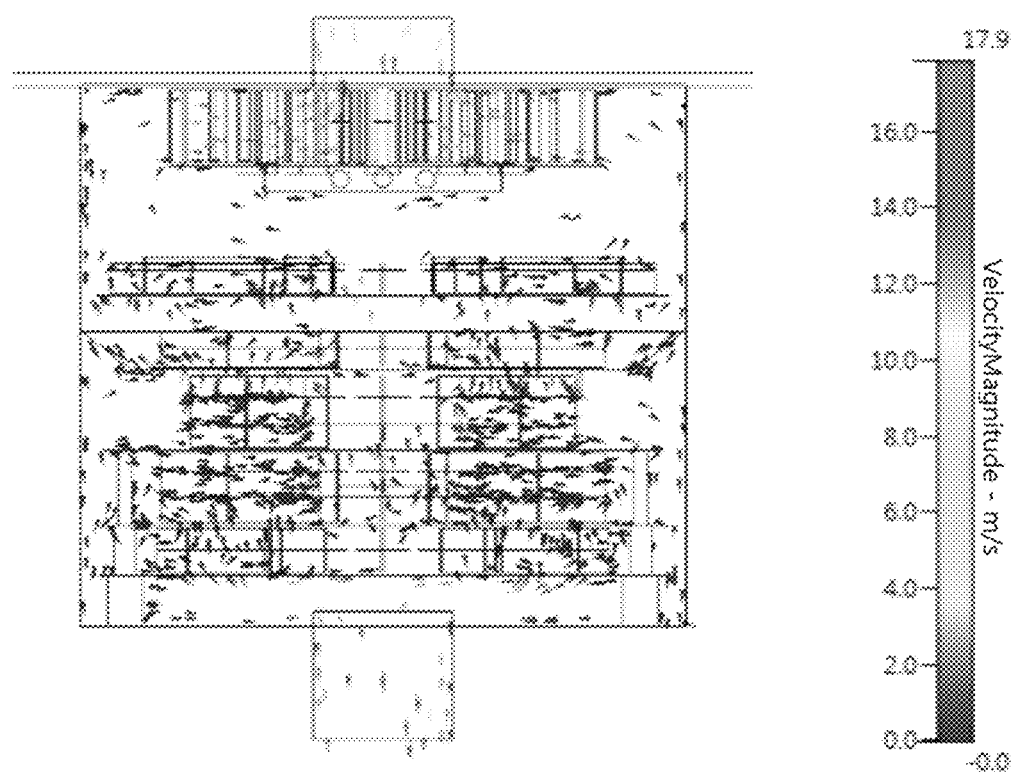
FIG. 14 is a view illustrating flow velocity vectors in the reaction by-product trapping apparatus according to the exemplary embodiment of the present disclosure.

FIG. 12 is an exemplified view illustrating gas flows in the reaction by-product trapping apparatus according to the exemplary embodiment of the present disclosure, FIG. 13 is a view illustrating flow velocity patterns in the reaction by-product trapping apparatus according to the exemplary embodiment of the present disclosure, and FIG. 14 is a view illustrating flow velocity vectors in the reaction by-product trapping apparatus according to the exemplary embodiment of the present disclosure.

As illustrated, it can be seen that the heater 2, which has the structure for diffusing the introduced unreacted gas by the diffuser 22 with the radially arranged dual structure while uniformly transferring the heat of the heater main body 21, is provided, and the internal trapping tower 3, which includes the plurality of disc-type trapping units vertically arranged in the multiple layers in order to uniformly trap the particulate reaction by-products in the form of a thin film while blocking and switching the flow paths of the gas, is provided, such that a symmetrical distribution of gas flows, which is divided based on the temperature, is formed as illustrated in the drawings, an effect of reducing flow velocities overall is implemented because of the formation of vortexes, and a reaction time of the reaction by-products is ensured.

Figure 15:
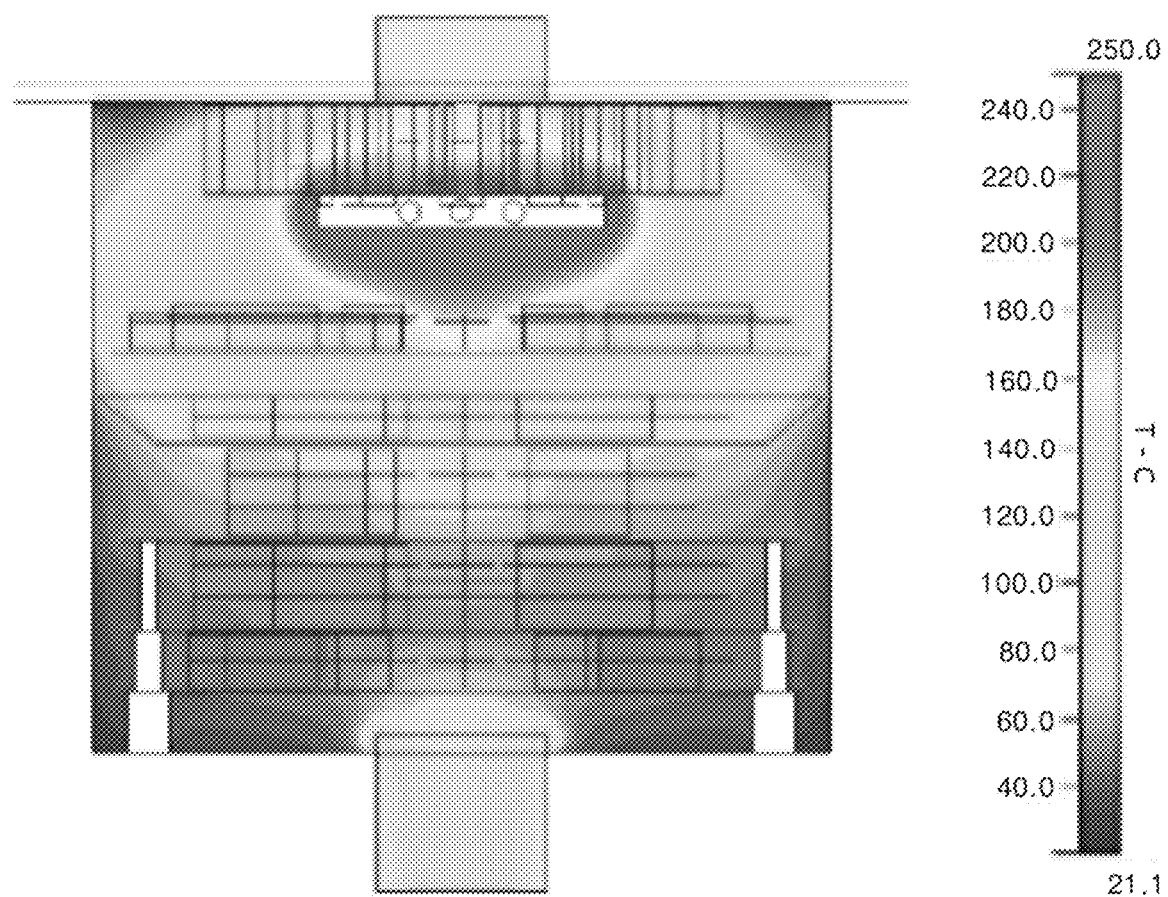
FIG. 15 is a view illustrating a temperature pattern in the reaction by-product trapping apparatus according to the exemplary embodiment of the present disclosure.
Figure 16:
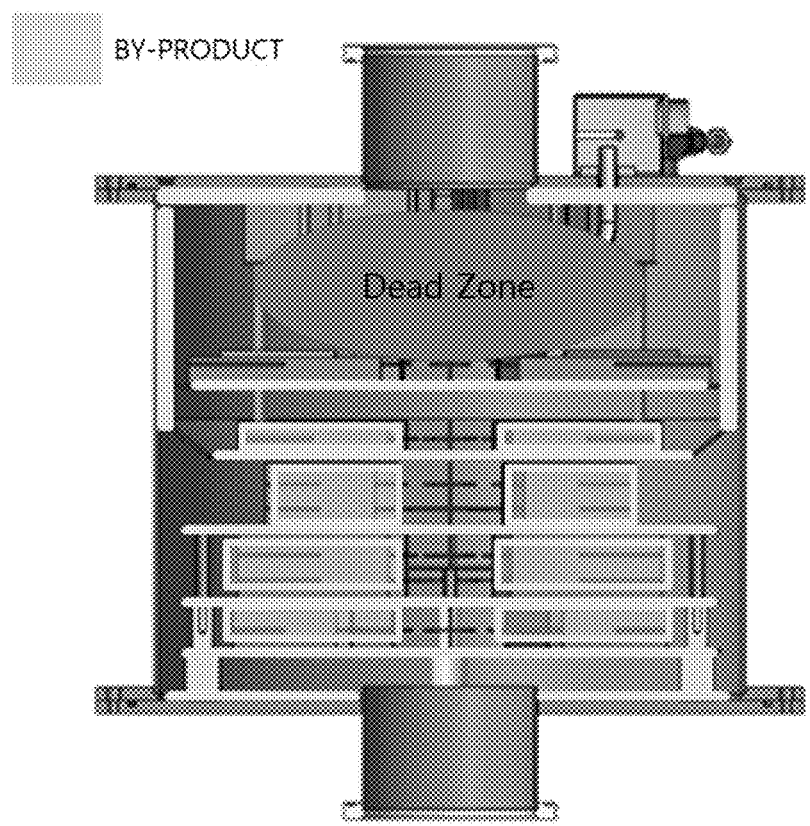
FIG. 16 is an exemplified view illustrating a trapping tendency in the reaction by-product trapping apparatus according to the exemplary embodiment of the present disclosure.

FIG. 15 is a view illustrating a temperature pattern in the reaction by-product trapping apparatus according to the exemplary embodiment of the present disclosure, and FIG. 16 is an exemplified view illustrating a trapping tendency in the reaction by-product trapping apparatus according to the exemplary embodiment of the present disclosure.

As illustrated, as a result of performing simulation on temperature patterns divided based on the temperature, it can be seen that a dead zone, in which it is impossible to trap the reaction by-products, occurs in the vicinity of the heater main body inside the housing due to an influence of the heater, but a temperature distribution tendency is uniformly maintained in the entire region. That is, it can be seen that the temperature range for enabling the trapping of the reaction by-products is ensured in most regions of the internal space of the housing.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. An apparatus for trapping a reaction by-product produced during an organic film deposition process, which is supplied with an unreacted gas discharged after a reaction in a process chamber for performing an organic film deposition process among semiconductor manufacturing processes, heats the unreacted gas with a heater, traps particulate reaction by-products with a reduced temperature in an available trapping space, and discharges remaining gas, the apparatus comprising:

a housing (1) configured to receive and discharge an introduced unreacted gas;
a heater (2) positioned inside the housing and configured to uniformly heat the introduced gas while diffusing the gas with a radially arranged diffuser having a structure; and
an internal trapping tower (3) in which a first disc-type trapping unit (31), a second disc-type trapping unit (32), a third disc-type trapping unit (33), a fourth disc-type trapping unit (34), and a fifth disc-type trapping unit (35), which each have a trapping disc and trapping plates radially arranged on or adjacent to the trapping disc and having a larger surface area than the trapping disc, the trapping disc having an exhaust hole formed in a central portion thereof or exhaust holes radially arranged in order to concentrate a flow of the gas or uniformly disperse and discharge the gas, are vertically arranged.

2. The apparatus of claim 1, wherein the first disc-type trapping unit (31) is configured such that a plurality of radially arranged trapping plates (311) guides the flow of the gas to the central portion, a central exhaust hole (312a) and a plurality of radially arranged circular exhaust holes (312b) formed in the trapping disc (312) discharge the gas downward, and the trapping plates (311) and the trapping disc (312) uniformly trap the reaction by-products in the form of a thin film.

3. The apparatus of claim 2, wherein the plurality of radially arranged trapping plates (311) comprises relatively large and long trapping plates (311) and relatively small, low, and short trapping plates (311) which are alternately installed.

4. The apparatus of claim 1, wherein the second disc-type trapping unit (32) is configured such that a plurality of radially arranged trapping plates (321) guides outward the flow of the supplied gas, an inclined guide (323) formed around the trapping disc (322) blocks the flow of the gas supplied from an upper or lateral side, collects the gas, and slows down the flow of the gas, the gas is uniformly discharged downward through radially arranged exhaust holes (322a) along the radially arranged trapping plates (321), and the trapping plates (321) and the trapping disc (322) uniformly trap the reaction by-products in the form of a thin film.

5. The apparatus of claim 4, wherein the inclined guide (323) is positioned to face an inner diameter of a housing main body (11), such that the gas uniformly supplied from the first disc-type trapping unit (31) at an uppermost side is not supplied directly to the plurality of disc-type trapping units present at a lower end of the second disc-type trapping unit.

6. The apparatus of claim 1, wherein the third disc-type trapping unit (33) is configured such that a plurality of radially arranged trapping plates (331) discharges the supplied gas downward in an outward direction of the trapping disc (332), the gas is uniformly discharged downward through a plurality of exhaust holes (332a) formed in a central portion of the trapping disc (332) and exhaust holes (332b) arranged radially, and the trapping plates (331) and the trapping disc (332) uniformly trap the reaction by-products in the form of a thin film.

7. The apparatus of claim 1, wherein the fourth disc-type trapping unit (34) is configured such that a plurality of radially arranged trapping plates (341) discharges the supplied gas downward in an outward direction of the trapping disc (342), the gas is uniformly discharged through exhaust holes (342a) radially arranged on the lower trapping disc (342), and the trapping plates (341) and the trapping disc (342) uniformly trap the reaction by-products in the form of a thin film.

8. The apparatus of claim 7, wherein a circular exhaust plate (343) is formed to be spaced apart upward from the central portion of the trapping disc (342) at a predetermined interval, such that lowered gas collides with the circular exhaust plate (343) to improve lateral exhaust efficiency through the trapping plates (341).

9. The apparatus of claim 6, wherein the trapping plates (331) have a vertical plate and first and second horizontal plates that divide the vertical plate into two portions, such that a cross section of the trapping plates (331) has a dual cross shape, and exhaust holes are formed in a longitudinal direction in the first horizontal plate.

10. The apparatus of claim 9, wherein the second horizontal plate has a larger cross-sectional area than the first horizontal plate positioned at an upper side and has a shape having a width that increases outward from the central portion of the trapping disc (332).

11. The apparatus of claim 1, wherein the fifth disc-type trapping unit (35) is configured such that a plurality of radially arranged trapping plates (351) guides the flow of the supplied gas outward, the gas is uniformly discharged downward through exhaust holes (352a) radially arranged around the trapping disc (352), the trapping disc (352) having a smaller diameter than the trapping disc (342) of the fourth disc-type trapping unit (34) and along the radially arranged trapping plates (351), and the trapping plates (351) and the trapping disc (352) uniformly trap the reaction by-products in the form of a thin film.

12. The apparatus of claim 11, wherein the trapping plates have a vertical plate and a horizontal plate that divides the vertical plate into two portions, such that a cross section of the trapping plates has a cross shape.

13. The apparatus of claim 1, wherein the heater (2) comprises:
a heater main body (21); and
a diffuser (22) fastened to an upper surface of the heater main body and having a structure arranged for supplying transfer heat to the introduced unreacted gas and diffusing the gas, and
wherein the diffuser (22) comprises:
a thermally conductive diffuser plate (221) configured to transfer heat to a region wider than a region of the heater main body;
a plurality of inner vertical diffuser plates (222) radially arranged in a circular shape at a central portion of the thermally conductive diffuser plate (221) and configured to diffuse the introduced unreacted gas while uniformly supplying heat; and
a plurality of outer vertical diffuser plates (223) radially arranged in a circular shape around the inner diffuser plates (222) on the thermally conductive diffuser plate (221) and configured to subdivide and diffuse the introduced unreacted gas while further subdividing the heat.

* * * * *